(12) United States Patent
Xie et al.

(10) Patent No.: US 10,797,260 B2
(45) Date of Patent: Oct. 6, 2020

(54) OLED SUBSTRATE AND FABRICATION METHOD THEREOF, AND DISPLAY PANEL

(71) Applicant: BOE TECHNOLOGY GROUP CO., LTD., Beijing (CN)

(72) Inventors: Dini Xie, Beijing (CN); Wei Li, Beijing (CN); Xiaojin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/453,422

(22) Filed: Jun. 26, 2019

(65) Prior Publication Data
US 2020/0035942 A1  Jan. 30, 2020

(30) Foreign Application Priority Data
Jul. 26, 2018 (CN) ............ 2018 1 0836210

(51) Int. Cl.
*H01L 51/00* (2006.01)
*H01L 27/00* (2006.01)
(Continued)

(52) U.S. Cl.
CPC ...... *H01L 51/5228* (2013.01); *H01L 27/3248* (2013.01); *H01L 51/5218* (2013.01); *H01L 51/56* (2013.01)

(58) Field of Classification Search
CPC ............ H01L 27/3248; H01L 27/3246; H01L 27/3276; H01L 27/3202; H01L 51/5228;
(Continued)

(56) References Cited

U.S. PATENT DOCUMENTS 6,887,100 B2 * 5/2005 Matsueda ........... H01L 27/3276
439/577
8,614,546 B2 * 12/2013 Utsunomiya ....... H01L 51/5228
313/506
(Continued)

FOREIGN PATENT DOCUMENTS

CN 107342370 11/2017
CN 107565048 1/2018

OTHER PUBLICATIONS

First Office Action dated Oct. 8, 2019 for Chinese Patent Application No. 201810836210.2.

*Primary Examiner* — Nikolay K Yushin
(74) *Attorney, Agent, or Firm* — Thomas | Horstemeyer LLP

(57) ABSTRACT

Embodiments of the present disclosure provide an OLED substrate and a fabrication method thereof, and a display panel. The method for fabricating an OLED substrate includes: forming an auxiliary cathode in a display region on a base substrate; forming an organic material functional layer in the display region on the base substrate where the auxiliary cathode is formed; applying a voltage to the auxiliary cathode to deform the auxiliary cathode, such that the organic material functional layer is ruptured by the deformed auxiliary cathode to form a connection channel; and forming a cathode in the display region on the base substrate where the organic material functional layer is formed. The cathode is electrically connected to the auxiliary cathode at the connection channel.

11 Claims, 5 Drawing Sheets

(51) Int. Cl.
*H01L 51/52* (2006.01)
*H01L 27/32* (2006.01)
*H01L 51/56* (2006.01)

(58) Field of Classification Search
CPC . H01L 51/5218; H01L 51/56; H01L 51/5206; H01L 51/0023; H01L 51/5209
See application file for complete search history.

(56) References Cited

U.S. PATENT DOCUMENTS

| | | | |
|---|---|---|---|
| 8,659,021 B2* | 2/2014 | You | H01L 27/124 257/59 |
| 9,147,724 B2* | 9/2015 | Moon | H01L 27/3279 |
| 10,263,212 B2* | 4/2019 | Lee | H01L 51/5228 |
| 2004/0115989 A1* | 6/2004 | Matsueda | H01L 27/3276 439/577 |
| 2010/0156273 A1* | 6/2010 | Utsunomiya | H01L 51/5228 313/498 |
| 2012/0146030 A1* | 6/2012 | You | H01L 27/124 257/59 |
| 2015/0144922 A1* | 5/2015 | Moon | H01L 27/3279 257/40 |
| 2016/0260924 A1 | 9/2016 | Lee et al. | |
| 2017/0155078 A1* | 6/2017 | Lee | H01L 27/3258 |

* cited by examiner

OLED SUBSTRATE AND FABRICATION METHOD THEREOF, AND DISPLAY PANEL

CROSS-REFERENCE TO RELATED APPLICATION

This application is based upon, claims the benefit of, and claims priority to Chinese Patent Application No. 201810836210.2, filed on Jul. 26, 2018, the entire contents thereof being incorporated herein by reference.

TECHNICAL FIELD

The present disclosure generally relates to the field of display technologies and, more particularly, to an OLED substrate, a fabrication method thereof, and a display panel.

BACKGROUND

Organic light emitting diode (OLED) display panels have attracted more and more attention due to their advantages of thin and lightweight design, active light emission, low cost, easy formation of flexible structures, wide viewing angle, etc.

OLED display panels include bottom emission type display panels and top emission type display panels, and the top emission type display panels have a huge advantage due to a high aperture ratio.

In top emission type OLED display panels, cathodes are made of transparent conductive materials. When current flows through the cathodes, a relatively large voltage drop may be generated due to relatively large impedance of the cathode materials. Moreover, as the size of the display panel increases, the voltage drop of the cathode increases significantly, which results in uneven display brightness.

SUMMARY

Embodiments of the present disclosure provide an OLED substrate, a fabrication method thereof, and a display panel.

In one aspect, a method for fabricating an OLED substrate is provided, which includes: forming an auxiliary cathode in a display region on a base substrate; forming an organic material functional layer in the display region on the base substrate where the auxiliary cathode is formed; applying a voltage to the auxiliary cathode to deform the auxiliary cathode, such that the organic material functional layer is ruptured by the deformed auxiliary cathode to form a connection channel; and forming a cathode in the display region and on the base substrate where the organic material functional layer is formed. The cathode is electrically connected to the auxiliary cathode at the connection channel.

In some embodiments, the auxiliary cathode includes a bottom electrode and a top electrode that are stacked, and the top electrode is positioned on a side of the bottom electrode away from the base substrate.

In some embodiments, a reflective anode is also synchronously formed when forming the bottom electrode of the auxiliary cathode.

In some embodiments, the bottom electrode is of a grid structure, has a plurality of top electrodes, and the plurality of top electrodes are arranged on the bottom electrode at intervals.

In some embodiments, a material of the top electrode is selected from at least one of $Cu_{60}Zn_{40}$, $FeNi_{22}Cr_3$, $FeNiMn_6$, $FeNi_{13}Mn_7$, and $Mn_{72}Cr_{18}Ni_{10}$.

In some embodiments, the base substrate is a TFT backplate.

In another aspect, an OLED substrate is provided, which is fabricated by the method for fabricating an OLED substrate described above.

In yet another aspect, an OLED substrate is provided, which includes: a substrate, and an auxiliary cathode, an organic material functional layer, and a cathode sequentially arranged on a base substrate and positioned in a display region. The organic material functional layer has at least one connection channel thereon. The cathode is electrically connected to the auxiliary cathode at the connection channel. The auxiliary cathode includes a bottom electrode and a top electrode that are stacked, and the top electrode is positioned on a side of the bottom electrode away from the base substrate.

In some embodiments, the OLED substrate further includes a reflective anode arranged in the display region and positioned on a side of the organic material functional layer close to the base substrate, and the bottom electrode and the reflective anode are arranged in the same layer.

In some embodiments, the bottom electrode is of a grid structure, has a plurality of top electrodes, and the plurality of top electrodes are arranged on the bottom electrode at intervals.

In yet another aspect, a display panel is provided, which includes the above-mentioned OLED substrate.

BRIEF DESCRIPTION OF THE DRAWINGS

To describe the technical solutions of the embodiments of the present disclosure or that of the prior art more clearly, the accompanying drawings required for describing the embodiments or the prior art will be briefly introduced below. Understandably, the accompanying drawings in the following description are merely some embodiments of the present disclosure. It is understood that, to those having ordinary skills in the art, other drawings may also be derived from these accompanying drawings without creative effort.

FIG. 2b is a schematic sectional view along an AA' direction in FIG. 2a;

FIG. 3a is a schematic top view of forming a pixel defining layer and an organic material functional layer on the basis of FIG. 2a;

FIG. 3b is a schematic sectional view along a BB' direction in FIG. 3a;

FIG. 4a is a schematic top view of forming a connection channel in the organic material functional layer on the basis of FIG. 3a;

FIG. 4b is a schematic sectional view I along a CC' direction in FIG. 4a;

FIG. 4c is a schematic sectional view II along the CC' direction in FIG. 4a;

FIG. 4d is a schematic sectional view III along the CC' direction in FIG. 4a;

DETAILED DESCRIPTION

Technical solutions in the embodiments of the present disclosure will be described clearly and completely below, in conjunction with the accompanying drawings in the embodiments of the present disclosure. Understandably, the described embodiments are some, but not all, of the embodiments of the present disclosure. All other embodiments obtained by those of ordinary skills in the art based on the embodiments of the present disclosure without creative efforts shall fall within the protection scope of the present disclosure.

Figure 1:
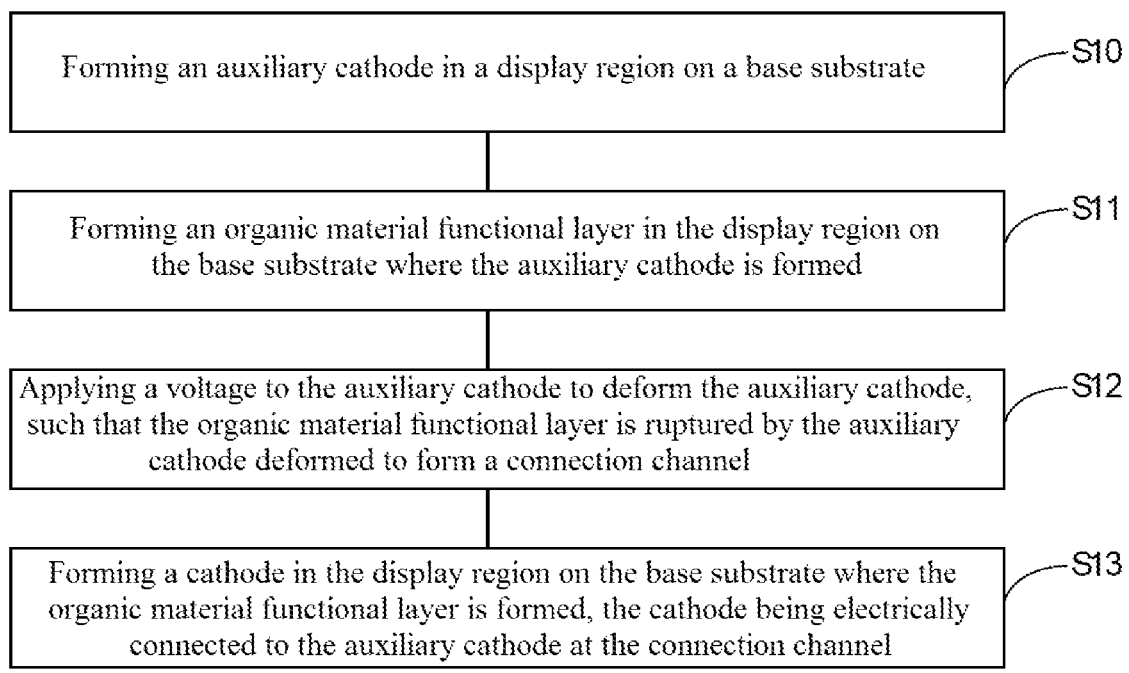
FIG. 1 is a schematic flow diagram of a method for fabricating an OLED substrate according to some embodiments of the present disclosure.

The embodiments of the present disclosure provide a method for fabricating an OLED substrate. As shown in FIG. 1, the method includes following steps.

Figure 2A:
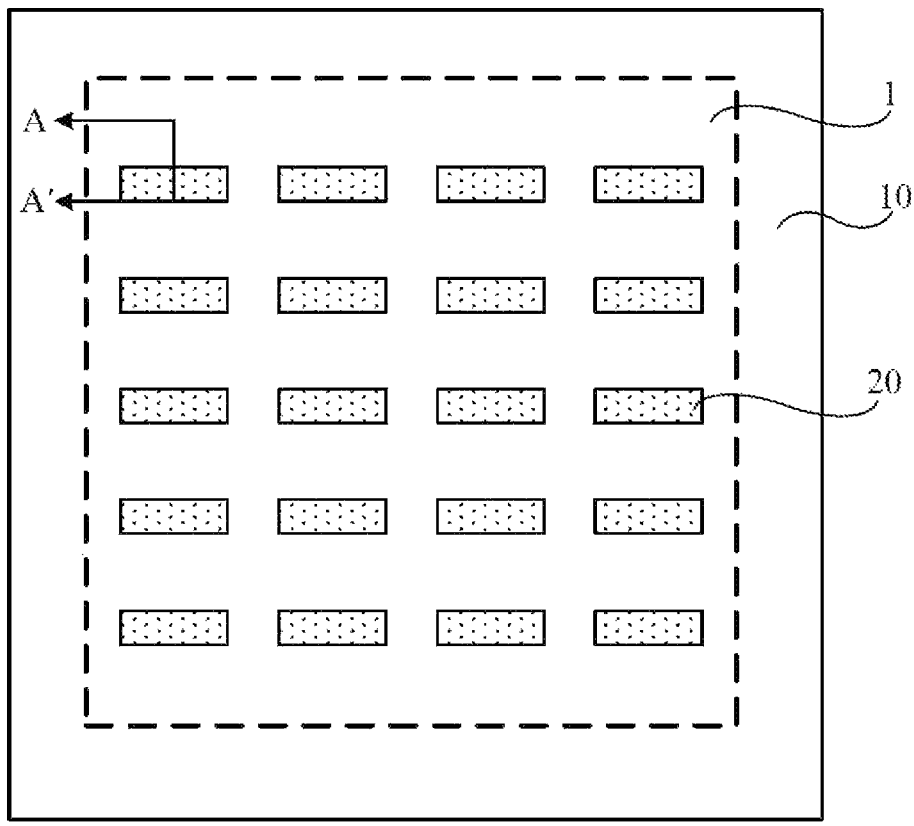
FIG. 2a is a schematic top view of forming an auxiliary cathode on a base substrate according to some embodiments of the present disclosure.
Figure 2B:
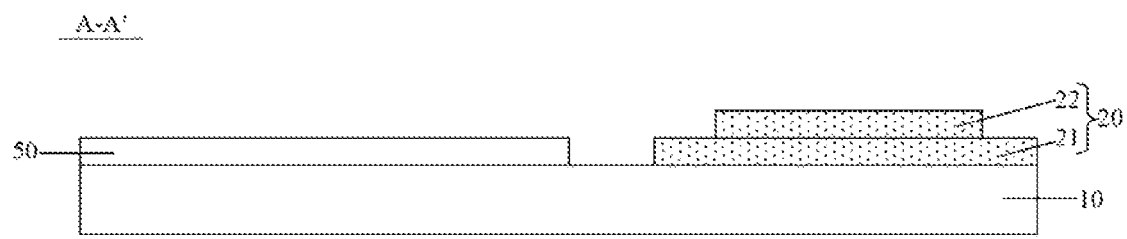

In Step S10, as shown in FIG. 2a and FIG. 2b, an auxiliary cathode 20 is formed on a display region 1 of a base substrate 10.

It is to be understood by those skilled in the art that a material of the auxiliary cathode 20 is a metal material, which is opaque. Therefore, the auxiliary cathode 20 is positioned in a non-light-emitting region of the display region 1.

Figure 3A:
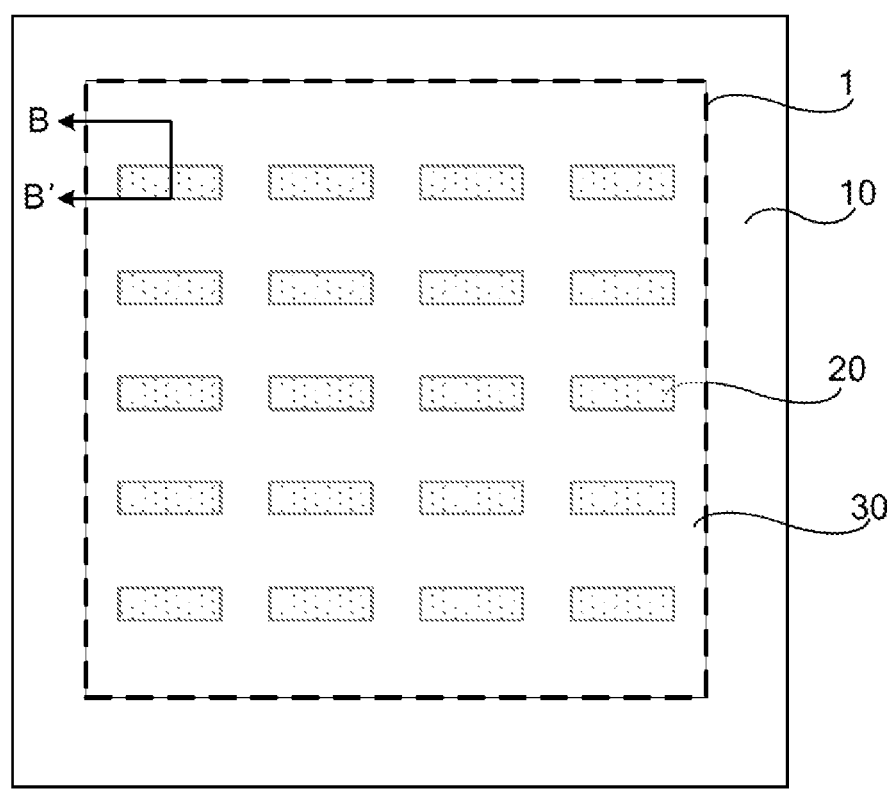
Figure 3B:
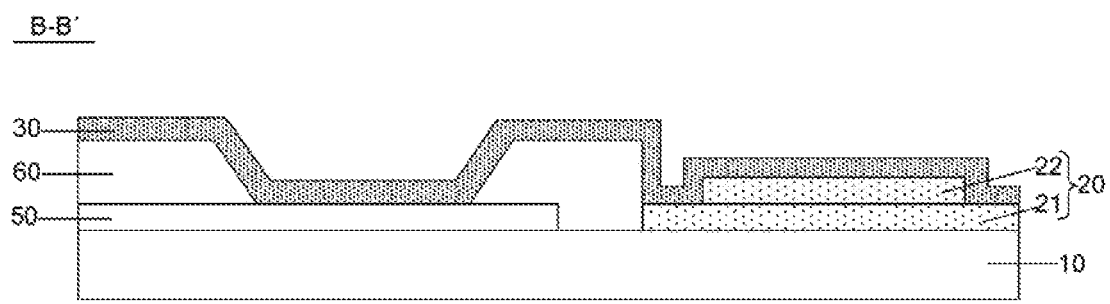

In Step S11, as shown in FIG. 3a and FIG. 3b, an organic material functional layer 30 is formed in the display region 1 on the base substrate where the auxiliary cathode 20 is formed.

Those skilled in the art appreciate that a pixel defining layer 60 is also formed on the base substrate 10 prior to forming the organic material functional layer 30.

In some embodiments, a light-emitting layer in the organic material functional layer 30 is a light-emitting layer emitting white light. On this basis, the organic material functional layer 30 may be formed by open mask evaporation. That is, the organic material functional layer 30 is positioned throughout the display region 1.

In some embodiments, the organic material functional layer 30 includes a hole transport layer and an electron transport layer in addition to the light-emitting layer. In other embodiments, the organic material functional layer 30 includes a hole injection layer, a hole transport layer, an electron transport layer, and an electron injection layer in addition to the light-emitting layer.

In Step S12, as shown in FIG. 4a, FIG. 4b, FIG. 4c and FIG. 4d, a voltage is applied to the auxiliary cathode 20 to deform the auxiliary cathode 20, such that the organic material functional layer 30 is ruptured by the deformed auxiliary cathode 20 to form a connection channel 301.

Figure 4A:
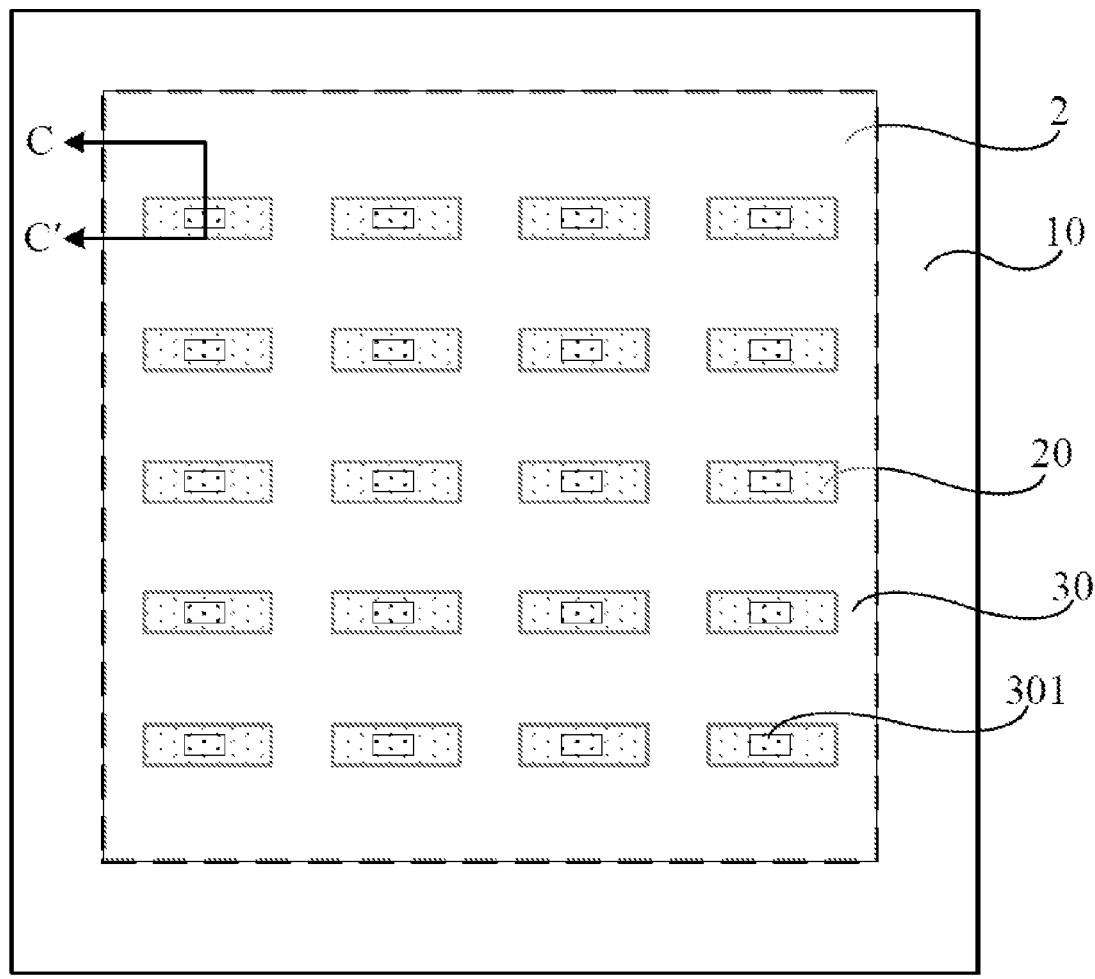
Figure 4B:
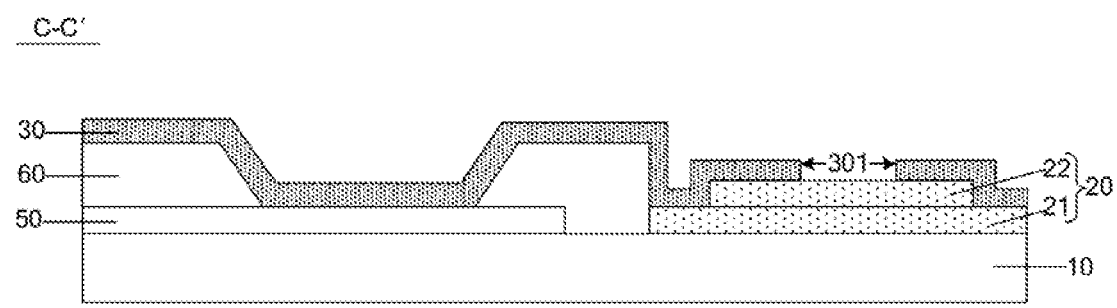
Figure 4C:
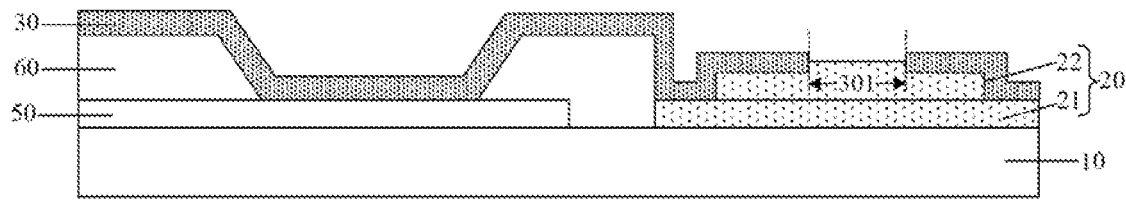
Figure 4D:
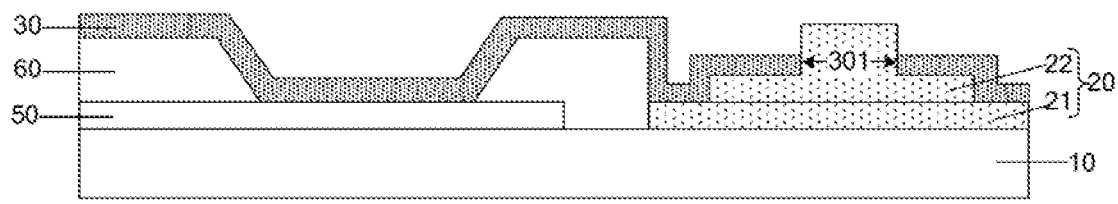

It is to be noted that the auxiliary cathode 20 is deformed by applying a voltage to the auxiliary cathode 20, such that the organic material functional layer 30 is ruptured by the deformed auxiliary cathode 20 to form the connection channel 301. After stopping an application of the voltage to the auxiliary cathode 20 after a certain time, the shape of the auxiliary cathode 20 may vary depending on different materials of the auxiliary cathode 20. For example, as shown in FIG. 4b, after an application of the voltage to the auxiliary cathode 20 is stopped after a certain time, the auxiliary cathode 20 is restored to the shape before the voltage is applied. In another example, as shown in FIG. 4c and FIG. 4d, after the application of the voltage to the auxiliary cathode 20 is stopped after a certain time, the auxiliary cathode 20 may not be restored to the shape before the voltage is applied. That is, the auxiliary cathode 20 is maintained in the deformed shape (as shown in FIG. 4d) or, even if the auxiliary cathode 20 is shrank, the deformation occurs with respect to that before the voltage is applied (as shown in FIG. 4c).

Here, the structure of the auxiliary cathode 20 is not limited as long as after the voltage is applied to the auxiliary cathode 20, the organic material functional layer 30 can be ruptured by the deformed auxiliary cathode 20 to form the connection channel 301.

Figure 5A:
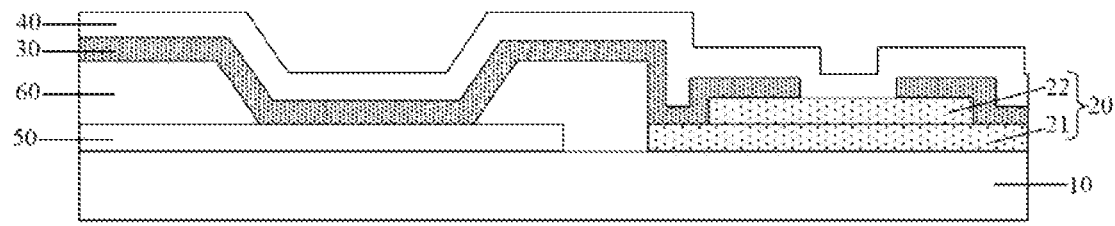
FIG. 5a is a schematic sectional view of an OLED substrate according to some embodiments of the present disclosure.
Figure 5B:
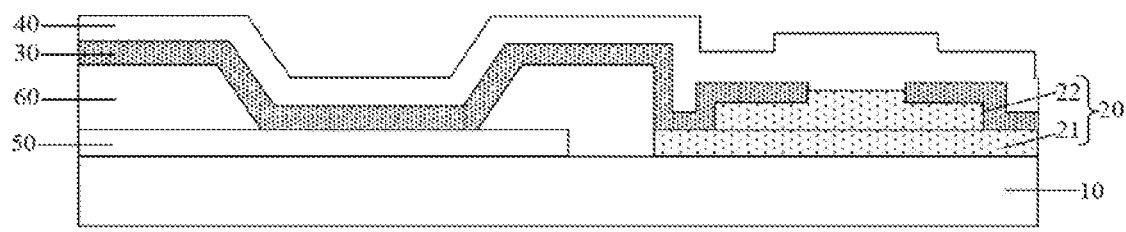
FIG. 5b is a schematic sectional view of another OLED substrate according to some embodiments of the present disclosure.
Figure 5C:
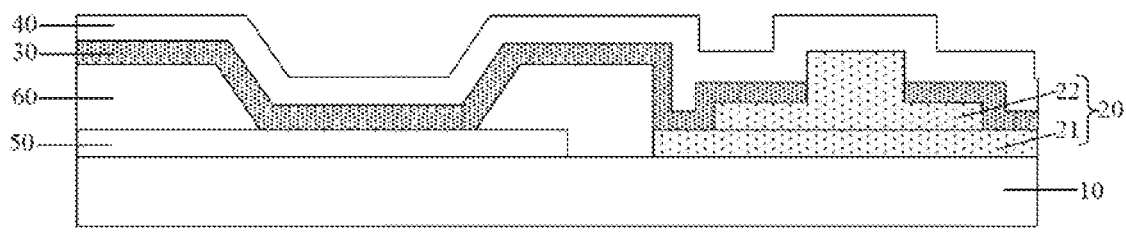
FIG. 5c is a schematic sectional view of still another OLED substrate according to some embodiments of the present disclosure.

In Step S13, as shown in FIG. 5a, FIG. 5b, and FIG. 5c, a cathode 40 is formed in the display region 1 on the substrate where the organic material functional layer 30 is formed. The cathode 40 is electrically connected to the auxiliary cathode 20 at a location of the connection channel 301.

The cathode 40 may also be formed by open mask evaporation.

Embodiments of the present disclosure provide a method for fabricating an OLED substrate. After the organic material functional layer 30 is formed, a voltage is applied to the auxiliary cathode 20 below the organic material functional layer 30 to deform the auxiliary cathode 20, such that the organic material functional layer 30 is ruptured by the deformed auxiliary cathode 20 to form a connection channel 301 at a location of the organic material functional layer 30 corresponding to the auxiliary cathode 20. In this way, the cathode 40 formed subsequently may be electrically connected to the auxiliary cathode 20 via the connection channel 301, thereby reducing voltage drop of the cathode 40. Compared with using a laser boring method, where the cathode 40 is electrically connected to the auxiliary cathode 20, which may result in a decrease in the yield of the OLED substrate, by using the method for fabricating an OLED substrate provided by the embodiments of the present disclosure, the product yield may be increased, and the costs of laser boring equipment may be saved.

In some embodiments, as shown in FIG. 2b, the auxiliary cathode 20 includes a stacked bottom electrode 21 and a top electrode 22. The top electrode 22 is positioned on a side of the bottom electrode 21 away from the base substrate 10.

Based on this, by utilizing the difference in thermal expansion coefficients of double-layer metals, the double-layer metals may be deformed under energization, thereby easily forming the connection channel 301 on the organic material functional layer 30.

In some embodiments, as shown in FIG. 2b, a reflective anode 50 is also synchronously formed when forming the bottom electrode 21 of the auxiliary cathode 20. That is, the bottom electrode 21 and the reflective anode 50 are formed by the same patterning process.

It is to be noted that the reflective anode 50 is formed in each sub-pixel region of the display region 1. Projections of the reflective anode 50 and the bottom electrode 21 on the base substrate 10 are not overlapped with each other. In each sub-pixel region, the reflective anode 50, the organic material functional layer 30, and the cathode 40 constitute an OLED device.

By forming the bottom electrode 21 and the reflective anode 50 via the same patterning process, the number of patterning processes may be reduced, and costs may be saved.

Figure 6:
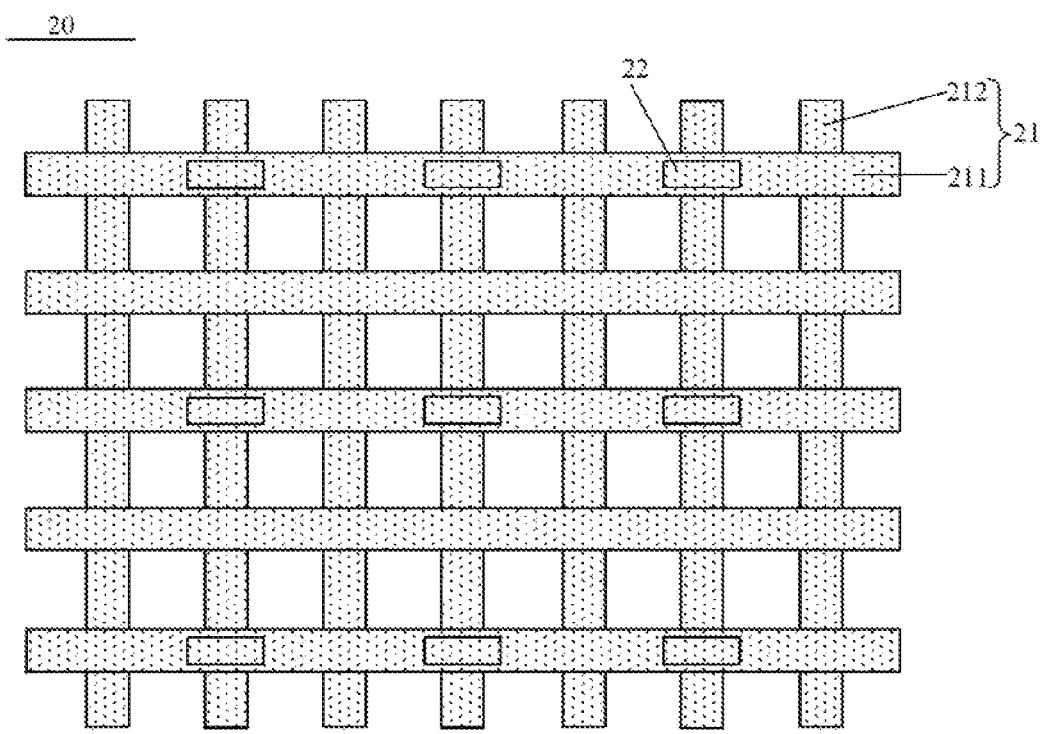
FIG. 6 is a schematic top view of an auxiliary cathode according to some embodiments of the present disclosure.

In some embodiments, as shown in FIG. 6, the bottom electrode 21 is of a grid structure. There may be a plurality of top electrodes 22, which are arranged on the bottom electrode 21 at intervals.

The bottom electrode 21 is of a grid structure. That is, as shown in FIG. 6, the bottom electrode 21 includes a plurality of first metal lines 211 in parallel and a plurality of second metal lines 212 in parallel, and the first metal lines 211 and the second metal lines 212 are intersected with each other.

In some embodiments, the top electrode 22 is evenly distributed on the bottom electrode 21, such that the cathode 40 has uniform electric resistance.

It is to be noted that the size of the top electrode 22 may be arbitrary as long as the connection channel 301 can be formed after the organic material functional layer 30 is ruptured by the deformed auxiliary cathode 20.

The number of the top electrodes 22 may be determined according to the number of the connection channels 301 to be formed. Specifically, the number of the top electrodes 22 may be appropriately set according to requirements such as process difficulty, costs, resistivity, and the like.

By designing the bottom electrode 21 into a grid structure, a plurality of top electrodes 22 are arranged on the bottom electrode 21 at intervals, making it easy to form a plurality of connection channels 301.

In some embodiments, a material of the top electrode 22 is selected from at least one of $Cu_{60}Zn_{40}$ (zinc-copper alloy), $FeNi_{22}Cr_3$ (iron-nickel-chromium alloy), $FeNiMn_6$ (iron-nickel-manganese alloy), $FeNi_{13}Mn_7$ (iron-nickel-manganese alloy), and $Mn_{72}Cr_{18}Ni_{10}$ (manganese-chromium-nickel alloy).

It is to be noted that the materials of the top electrode 22 are not limited to the above materials enumerated, and may also be other metals or alloys having high thermal expansion coefficients.

In some embodiments, the base substrate 10 is a TFT (Thin Film Transistor) backplate.

That is, if the OLED device is driven to emit light by a drive circuit including a TFT, a resolution may be improved.

In some embodiments, the material of the cathode 40 includes IZO (indium zinc oxide). The thickness of the cathode 40 ranges from 1,000 Å to 3,000 Å. Thus, the transparency of the cathode 40 may be better, and the light emission rate may be improved.

The embodiments of the present disclosure provide an OLED substrate, which may be fabricated by the above-described fabrication method.

The embodiments of the present disclosure also provide an OLED substrate. As shown in FIG. 5a, FIG. 5b and FIG. 5c, the OLED substrate includes: a base substrate 10, an auxiliary cathode 20, an organic material functional layer 30, and a cathode 40 sequentially arranged on the substrate 10 and positioned in a display region. The organic material functional layer 30 has at least one connection channel 301 thereon. The cathode 40 is electrically connected to the auxiliary cathode 20 at the connection channel 301. The auxiliary cathode 20 includes a bottom electrode 21 and a top electrode 22 that are stacked, and the top electrode 22 is positioned on a side of the bottom electrode 21 away from the base substrate 10.

Based on this, according to the method described above, by utilizing the difference in thermal expansion coefficients of double-layer metals, the double-layer metals may be deformed under energization, thereby easily forming the connection channel 301 on the organic material functional layer 30.

It is to be noted that, after an application of a voltage to the auxiliary cathode 20 for a certain time is stopped, the auxiliary cathode 20 may be restored to the shape before the voltage is applied (that is, as shown in FIG. 5a, a contact interface between the cathode 40 and the auxiliary cathode 20 is positioned on a side of the organic material functional layer 30 close to the base substrate 10). In another example, as shown in FIG. 5b and FIG. 5c, after an application of the voltage to the auxiliary cathode 20 for a certain time is stopped, the auxiliary cathode 20 may not restore to the shape before the voltage is applied. That is, the auxiliary cathode 20 is maintained in the deformed shape (that is, as shown in FIG. 5c, a contact interface between the cathode 40 and the auxiliary cathode 20 is positioned on a side of the organic material functional layer 30 away from the base substrate 10), or even if the auxiliary cathode 20 is shrank, the deformation occurs with respect to that before the voltage is applied (that is, as shown in FIG. 5b, the contact interface between the cathode 40 and the auxiliary cathode 20 is positioned in the connection channel 301).

In some embodiments, as shown in FIG. 5a, FIG. 5b and FIG. 5c, the OLED substrate further includes a reflective anode 50 arranged in the display region and positioned on a side of the organic material functional layer 30 close to the base substrate 10. The bottom electrode 21 and the reflective anode 50 are arranged in the same layer. That is, the bottom electrode 21 and the reflective anode 50 are formed by the same patterning process.

It is to be noted that the reflective anode 50 is formed in each sub-pixel region of the display region. Projections of the reflective anode 50 and the bottom electrodes 21 on the base substrates 10 are not overlapped with each other.

By forming the bottom electrode 21 and the reflective anode 50 via the same patterning process, the number of patterning processes may be reduced, and costs may be saved.

In some embodiments, as shown in FIG. 6, the bottom electrode 21 is of a grid structure. There may be a plurality of top electrodes 22, which are arranged on the bottom electrode 21 at intervals.

The bottom electrode 21 is of a grid structure. That is, as shown in FIG. 6, the bottom electrode 21 includes a plurality of first metal lines 211 in parallel and a plurality of second metal lines 212 in parallel, and the first metal lines 211 and the second metal lines 212 are intersected with each other.

In some embodiments, the top electrode 22 is evenly distributed on the bottom electrode 21, such that the cathode 40 has a uniform electric resistance.

It is to be noted that the size of the top electrode 22 may be arbitrary as long as the organic material functional layer 30 can be ruptured.

The number of the top electrodes 22 may be determined according to the number of the connection channels 301 to be formed. Specifically, the number of the top electrodes 22 may be appropriately set according to requirements such as process difficulty, costs, resistivity, and the like.

By designing the bottom electrode 21 into a grid structure, a plurality of top electrodes 22 are arranged on the bottom electrode 21 at intervals, making it easy to form a plurality of connection channels 301.

The embodiments of the present disclosure further provide a display panel, which includes the foregoing OLED substrate.

The above-mentioned embodiments are merely specific embodiments of the present disclosure, but the protection scope of the present disclosure is not limited thereto. Any variation or substitution easily conceivable to a person of ordinary skills in the art within the technical scope disclosed in the present disclosure shall fall into the protection scope of the present disclosure. Therefore, the protection scope of the present disclosure shall be subject to the protection scope of the claims.

What is claimed is:

1. A method for fabricating an OLED substrate, comprising:
    forming an auxiliary cathode in a display region on a base substrate;
    forming an organic material functional layer in the display region on the base substrate where the auxiliary cathode is formed;
    supplying electric power to the auxiliary cathode to deform the auxiliary cathode, such that the organic material functional layer is ruptured by the auxiliary cathode deformed to form a connection channel; and
    forming a cathode in the display region on the base substrate where the organic material functional layer is formed, wherein the cathode is electrically connected to the auxiliary cathode at the connection channel.

2. The method for fabricating the OLED substrate according to claim 1, wherein a material of the top electrode is selected from at least one of: $Cu_{60}Zn_{40}$, $FeNi_{22}Cr_3$, $FeNiMn_6$, $FeNi_{13}Mn_7$, and $Mn_{72}Cr1_8Ni_{10}$.

3. The method for fabricating the OLED substrate according to claim 1, wherein the base substrate is a TFT backplate.

4. The method for fabricating the OLED substrate according to claim 1, wherein the auxiliary cathode comprises a bottom electrode and a top electrode that are stacked, and the top electrode is positioned on a side of the bottom electrode away from the base substrate.

5. The method for fabricating the OLED substrate according to claim 4, wherein a reflective anode is synchronously formed when the bottom electrode of the auxiliary cathode is formed.

6. The method for fabricating the OLED substrate according to claim 4, wherein:
    the bottom electrode is of a grid structure;
    the bottom electrode comprises a plurality of top electrodes; and
    the plurality of top electrodes are arranged on the bottom electrode at intervals.

7. An OLED substrate, comprising:
    a base substrate, an auxiliary cathode, an organic material functional layer, and a cathode sequentially arranged on the base substrate and positioned in a display region,
    wherein the organic material functional layer has at least one connection channel penetrating therethrough, and the cathode is electrically connected to and contacted with the auxiliary cathode through the at least one connection channel,
    wherein the auxiliary cathode comprises a bottom electrode and a top electrode that are stacked, and the top electrode is positioned on a side of the bottom electrode away from the base substrate, and
    wherein a part of the top electrode protrudes into the at least one connection channel.

8. A system, comprising:
    an organic light-emitting diode (OLED) substrate, comprising:
        a base substrate, an auxiliary cathode, an organic material functional layer, and a cathode sequentially arranged on the base substrate and positioned in a display region,
        wherein the organic material functional layer has at least one connection channel penetrating therethrough, and the cathode is electrically connected to and contacted with the auxiliary cathode through the at least one connection channel,
        wherein the auxiliary cathode comprises a bottom electrode and a top electrode that are stacked, and the top electrode is positioned on a side of the bottom electrode away from the base substrate, and
        wherein a part of the top electrode protrudes into the at least one connection channel.

9. The system according to claim 8, wherein the OLED substrate further comprises a reflective anode arranged in the display region and positioned on a side of the organic material functional layer close to the based substrate, wherein:
    the bottom electrode and the reflective anode are arranged in a same layer;
    the bottom electrode is of a grid structure;
    the bottom electrode comprises a plurality of top electrodes; and
    the plurality of top electrodes are arranged on the bottom electrode at intervals.

10. The system according to claim 8, further comprising a display panel, wherein the display comprises the OLED substrate.

11. The system according to claim 10, wherein the OLED substrate further comprises a reflective anode arranged in the display region and positioned on a side of the organic material functional layer close to the based substrate, wherein:
    the bottom electrode and the reflective anode are arranged in a same layer;
    the bottom electrode is of a grid structure;
    the bottom electrode comprises a plurality of top electrodes; and
    the plurality of top electrodes are arranged on the bottom electrode at intervals.

* * * * *